(12) United States Patent
Yokomori

(10) Patent No.: US 8,476,561 B2
(45) Date of Patent: Jul. 2, 2013

(54) SUBSTRATE HEATING DEVICE AND SUBSTRATE HEATING METHOD

(75) Inventor: Takehiko Yokomori, Himeji (JP)

(73) Assignee: Ushiodenki Kabushiki Kaisha, Tokyo (JP)

(*) Notice: Subject to any disclaimer, the term of this patent is extended or adjusted under 35 U.S.C. 154(b) by 1196 days.

(21) Appl. No.: 12/341,347

(22) Filed: Dec. 22, 2008

(65) Prior Publication Data
US 2009/0166351 A1 Jul. 2, 2009

(30) Foreign Application Priority Data

Dec. 28, 2007 (JP) ................................. 2007-339823

(51) Int. Cl.
| | |
|---|---|
| B23K 1/02 | (2006.01) |
| B23K 1/22 | (2006.01) |
| B23K 11/00 | (2006.01) |
| C23C 16/00 | (2006.01) |
| B05C 11/00 | (2006.01) |
| C23F 1/00 | (2006.01) |
| H01L 21/306 | (2006.01) |
| H01J 7/44 | (2006.01) |
| H01J 7/24 | (2006.01) |
| H05B 39/00 | (2006.01) |
| H05B 41/14 | (2006.01) |

(52) U.S. Cl.
USPC ........... 219/492; 219/411; 219/414; 219/385; 118/724; 118/725; 118/666; 118/668; 118/715; 156/345.24; 156/345.27; 156/345.37; 315/94; 315/32; 315/112

(58) Field of Classification Search
USPC .......... 219/492, 411, 414, 385; 118/724–725, 118/666, 668, 715, 722, 728; 156/345.24, 156/345.27, 345.37; 315/94, 32, 112
See application file for complete search history.

(56) References Cited

U.S. PATENT DOCUMENTS

| | | | |
|---|---|---|---|
| 4,275,335 A | 6/1981 | Ishida | |
| 4,615,765 A * | 10/1986 | Levinson et al. | 438/676 |
| 5,841,110 A * | 11/1998 | Nenyei et al. | 219/497 |
| 5,880,823 A * | 3/1999 | Lu | 356/72 |
| 5,945,790 A * | 8/1999 | Schaefer | 315/335 |
| 6,376,806 B2 * | 4/2002 | Yoo | 219/411 |
| 6,842,582 B2 * | 1/2005 | Morimoto et al. | 392/416 |
| 6,951,996 B2 * | 10/2005 | Timans et al. | 219/390 |

(Continued)

FOREIGN PATENT DOCUMENTS

| | | |
|---|---|---|
| JP | 1-127854 A | 5/1989 |
| JP | 3-68399 U | 7/1991 |

(Continued)

*Primary Examiner* — Joseph M Pelham
*Assistant Examiner* — Gyounghyun Bae
(74) *Attorney, Agent, or Firm* — Roberts Mlotkowski Safran & Cole, P.C.; David S. Safran

(57) ABSTRACT

A device for heating a substrate with light from a flash lamp having a semiconductor switch connected in series to the flash lamp. After triggering of a trigger electrode of the flash lamp, a first drive signal and a second drive signal are output from a gate circuit. The time period when the semiconductor switch is on due to the second drive signal is longer than the time period that the semiconductor switch is on by the first drive signal. Then, the semiconductor switch is switched on and off by the first drive signal and the substrate temperature is increased to a temperature, which is lower than the desired temperature to be achieved, and is maintained a that temperature for a short time, after which the surface temperature of the substrate is increased to the desired target temperature.

6 Claims, 9 Drawing Sheets

U.S. PATENT DOCUMENTS

| | | |
|---|---|---|
| 6,998,715 B1 * | 2/2006 | Fuji et al. ............... 257/773 |
| 7,072,579 B2 * | 7/2006 | Kusuda ............... 392/416 |
| 2002/0179589 A1 * | 12/2002 | Morita et al. ............ 219/411 |
| 2009/0103906 A1 | 4/2009 | Kusuda |

FOREIGN PATENT DOCUMENTS

| | | |
|---|---|---|
| JP | 4-296834 A | 10/1992 |
| JP | 9-51667 A | 2/1997 |
| JP | 2002-198322 A | 7/2002 |
| JP | 2002-252174 A | 9/2002 |
| JP | 4-296834 A | 12/2008 |
| JP | 2009-99758 A | 5/2009 |
| WO | 03/085343 A1 | 10/2003 |

* cited by examiner

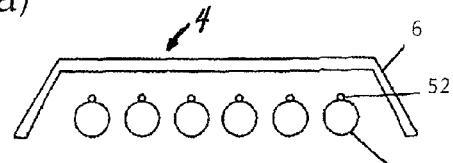
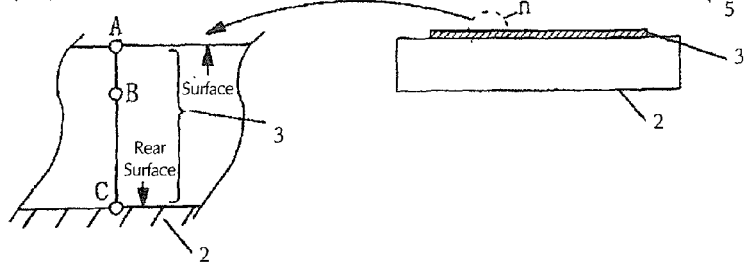
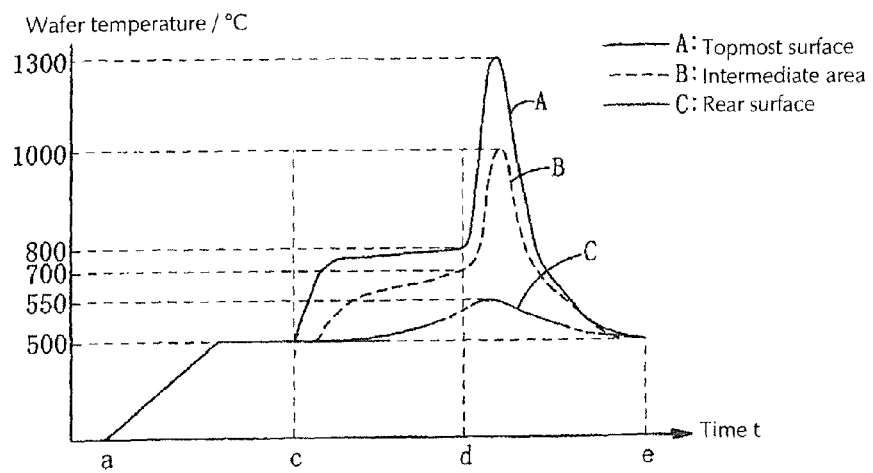
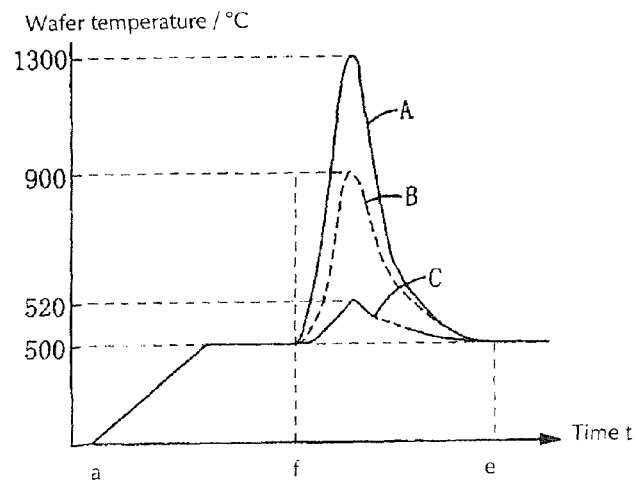

SUBSTRATE HEATING DEVICE AND SUBSTRATE HEATING METHOD

BACKGROUND OF THE INVENTION

1. Field of Invention

The present invention relates to a heating device used in the production process for semiconductors and thin-film transistors, and relates to a flash lamp heating device using a flash lamp as a heating source.

2. Description of Related Art

Conventionally, in order to inject ions onto a most-surface of a substrate, such as a semiconductor wafer, or to activate a substrate, the substrate is rapidly heated, and consequently, a device for heating a substrate using a flash lamp is well known (see, Japanese Laid-Open Patent Application No. 2002-198322 and Japanese Laid-Open Patent Application No. 2001-319887 (corresponding to US 2002-0179589 A)).

Further, a device for heating a substrate by light from both surfaces, wherein background heating (preheating) is conducted using a halogen lamp, and then, the substrate is rapidly heated with a flash lamp to the temperature for activating the substrate is also well known (see, International Patent Application Publication No. WO 03/085343).

The flash lamp is a lamp where luminescent gas, for example, xenon (Xe), is enclosed in the sealed inside of a rod-shaped luminous tube, for example, made from silica glass, and a pair of electrodes are arranged by facing each other inside the rod-shaped luminous tube. A rod-shaped conductor, for example, made from stainless steel is placed on the outer surface of the luminous tube of the flash lamp along a longitudinal direction of the luminous tube as a trigger electrode. The flash lamp is lit by supplying high voltage to the trigger electrode.

FIG. 9 shows an example of a lighting circuit of the conventional flash lamp.

A coil 23 is connected to a high-voltage side 22 of a flash lamp 5 and to ground 24, and a capacitor 26 is connected in parallel to a series circuit of the flash lamp 5 and the coil 23. Energy is supplied to the flash lamp from the capacitor 26. Supplying energy to the capacitor 26 is started by switching on a switch SW1 arranged at the high-voltage side 22.

In addition, a trigger electrode 52 is placed to illuminate the flash lamp 5, and the trigger electrode 52 is connected to a trigger coil 30. Switching on a switch SW2 and supplying voltage pulses HV to the primary side of the trigger coil 30 cause the application of high voltage to the trigger electrode 52, and the flash lamp 5 is lit.

Lower power, more compact semiconductor integrated circuits have made the transistor circuit produced within the circuit itself to become a very micro-fabricated circuit. Specifically, it is necessary to reduce the depth of a diffusion layer of impurity atoms contained in the semiconductor layer for forming the source and drain at both sides of the gate in the transistor circuit. On the other hand, the surface resistance value ($\Omega/cm^2$) of the semiconductor circuit needs to be lowered.

The depth of the diffusion layer of the impurity atoms in the transistor circuit formed on the semiconductor wafer can be reduced by lowering the diffusion temperature or shortening the time during doping of impurity atoms in a diffusion process to dope and diffuse impurity atoms on the semiconductor wafer.

On the other hand, in the activation process to activate the impurity diffusion layer and to lower the surface resistance value ($\Omega/cm^2$), impurities (dopant) to be diffused on the semiconductor wafer are positioned not in alignment to the silicon crystal lattice location after the diffusion process; however, the activation is completed when the dopant itself finds the closest crystal lattice and returns to a proper position. This phenomenon requires only such a short time as approximately 10 nano-seconds.

Achieving both the high activation and the lower diffusion is realized by rising the temperature as much as possible and conducting a thermal treatment in a short time.

For example, if the material used for the semiconductor wafer is silicon, it should be heated at around 1,400° C., which is a temperature sufficient to melt silicon, for a moment.

As one example, a case of a silicon wafer using boron as a dopant is shown. The silicon wafer needs to be heated at 1,000° C. or higher for 1.5 seconds or longer, when the silicon wafer is heated by the conventional spike RTA (optical rapid thermal annealing using a halogen lamp), and setting the resistance value to 1,000 $\Omega/cm^2$. However, heating at this temperature for this time period will move (diffuse) boron at a certain concentration, which is situated around 10 nm deep before heating, to a depth around 30 nm after the spike RTA heating.

On the other hand, if heating with a flash lamp and similarly irradiating so as to bring the resistance value to 1,000 $\Omega/cm^2$, boron at a certain concentration situated around 10 nm deep does not excessively diffuse in the depth direction even after heating with the flash lamp, and stays around 10 nm. Heating for a short period is necessary in order not to diffuse the dopant, and heating with the flash lamp makes this possible in actuality.

In fact, when the heating time becomes longer and the temperature throughout the entire semiconductor wafer rises higher, the dopant diffuses in the depth direction of the semiconductor wafer. However, heating with the flash lamp can prevent excessive ion diffusion.

However, when actually heating a substrate, such as semiconductor wafers, using a flash lamp, the temperature of the substrate rises abruptly by light irradiation, and by the abrupt rise of temperature, there are problems of deformation or cracking by the thermal strain occurring to the substrate.

As mentioned above, using a flash lamp enables short-time heating without ion diffusion spreading the entire substrate. However, rising the temperature abruptly for a short time causes problems, such as deformation or cracking due to the thermal strain resulting from the difference in temperature on the surface and the bottom of the substrate.

SUMMARY OF THE INVENTION

The present invention is directed to the solving of problems of the type described above. In particular, the present invention has an object of providing a substrate heating device that can activate a topmost surface of the substrate while suppressing distortion or breaking of the substrate when rapidly heating the substrate using a flash lamp, implanting ions and activating the topmost surface of the substrate.

After considering many ways to solve the problems mentioned above, it has been discovered that deformation or cracking in a substrate can be reduced by not increasing the surface temperature of the substrate to a desired temperature to be achieved at once, but by increasing the substrate temperature up to a second temperature, which is lower than the desired temperature, and keeping the substrate temperature at that temperature for a short time, or by increasing the temperature at a controlled temperature rising rate, and then, increasing the surface temperature of the substrate to the desired temperature to be achieved.

Herein, as described above, if the heating time is long and the temperature is high throughout the entire substrate, ion diffusion will spread across the entire substrate. Therefore, in order to have a difference in temperature between the surface and the bottom of the substrate which does not cause ion diffusion to spread throughout the entire substrate, the retention time of the second temperature is sufficiently shortened, or the rising time of the temperature is adjusted to be sufficiently short, and in addition, the temperature difference between the surface and the bottom of the substrate is adjusted to be within a temperature difference that will not cause distortion or cracking due to thermal strain.

Based upon the descriptions above, the present invention solves the problem as follows:

(1) A substrate heating device for heating a substrate by a lamp heating device, comprises: a power source; a capacitor charged by the power source; flash lamps that discharge by electrical charges accumulated in the capacitor; an inductor connected between the capacitor and the flash lamp; a trigger unit causing the flash lamp to start discharging, wherein a diode is connected in parallel to a series circuit comprising the flash lamp and the inductor, and a semiconductor switch is connected in series to the flash lamp.

Further, a drive circuit for outputting a first drive signal that causes the semiconductor switch to turn on and off at least once after a trigger signal is input into the trigger unit, and for outputting a second drive signal causing the semiconductor switch to turn on only once after the first drive signal is output is established.

Then, a time period when the second drive signal causes the semiconductor switch to turn on is longer than that when a drive signal within the first drive signals causes the semiconductor switch to turn on, and the flash lamp is lit by switching on and off the semiconductor switch by the first drive signal, and the substrate temperature is increased to the second temperature, which is lower than the desired temperature to be achieved, and maintained at the temperature for a short time, or the temperature is increased while the temperature elevation rate is controlled, and then, the semiconductor switch is switched on by the second drive signal and the substrate temperature of the substrate is increased to the desired temperature to be achieved.

(2) In the above-mentioned solution (1), a second heating device is arranged on the other side of the flash lamp, relative to the substrate that is heated by the lamp heating device.

(3) In the above-mentioned solutions (1) and (2), the first drive signal is an on-off signal where an ON signal causes the semiconductor switch to remain in the on-state and an off signal causes the off-state to alternately appear more than once.

(4) In the above-mentioned solution (3), a duty ratio [period of on signal/(period of on signal+period of off signal)] of the on-off signal is changed during the period when the first drive signal is output.

(5) In the above-mentioned solutions (1), (2) and (3), an insulated gate bipolar transistor (IGBT element) is used as the semiconductor switch.

The present invention can provide the following effects:

(1) The first drive signal that switches on and off the semiconductor switch connected in series to the flash lamp at least once and the second drive signal that switches on the semiconductor switch only once after the first drive signal is output, the on-period time of the semiconductor switch by the second drive signal is adjusted so as to be longer than the on-period time of the semiconductor switch by one of the first drive signals, then the first drive signal switches on and off the semiconductor switch and the flash lamp is lit, and the temperature of the substrate is increased to the second level, which is lower than the desired temperature to be achieved, or increased while controlling the rising rate of temperature, and then, the semiconductor switch is switched on by the second drive signal, and the temperature is increased to the desired temperature to be achieved, so the strain due to the temperature difference in the thickness direction of the substrate to be heated can be minimized, and deformation or cracking can be suppressed.

In other words, extending the on-period time of the semiconductor switch by the second drive signal compared to the on-period time of the semiconductor by one of the first drive signals can increase the temperature rising rate by the second drive signal compared to that by the first drive signal, and thermal damage from the elevating-temperature of the substrate can be reduced, and deformation and cracking can be suppressed.

Further, sufficient shortening of the heating time by the first drive signal and controlling of the temperature difference between the surface and the bottom of the substrate in order not to spread the ion diffusion throughout the entire substrate enable the prevention of the ion diffusion from spreading throughout the entire substrate.

(2) When heating the substrate, placing a second heating device on the opposite side of the flash lamp relative to the substrate enables pre-heating of the substrate without blocking the light irradiation of the flash lamp. Therefore, it enables the input power to the flash lamp for heating the substrate up to the desired temperature to be reduced, and reduces a burden on the flash lamp so that the flash lamp can last longer. Further, pre-heating the substrate by resistance heating enables the reduction of the temperature difference in the thickness direction of the substrate and suppression of deformation and cracking of the substrate.

(3) The first drive signal is an on-off signal where an ON signal causing the semiconductor switch to keep in the ON state and an OFF signal causing the switch to stay in the OFF state alternate more than once, and thus makes it possible to set the temperature rise rate by the first drive signal as desired by changing the duty ratio of the on-off signal [period of ON signal/(period of ON signal+period of OFF signal)] during the period.

Further, the duty ratio of the on-off signal is changed within a time period while the first drive signal is output, and for example, gradually raising the duty ratio enables the temperature to rise at the given rising rate, so that heat damage to the substrate at the time of raising the temperature can be reduced, and deformation and cracking can be suppressed.

(4) Using an insulated gate bipolar transistor (IGBT element) as the semiconductor switch enables the discharging current to be switched in a pulse manner even with a flash lamp that requires a large current. Consequently, luminescence of the flash lamp can be controlled to a desired degree by consuming the energy accumulated in the capacitor while it is controlled.

The substrate heating device of the present invention, on the occasion of rapidly heating the semiconductor wafer, uses a lighting circuit in which a diode is connected in parallel to a series circuit of the flash lamp and an inductance, and the semiconductor switch is connected in series to the flash lamp, and when the flash lamp is lit, the substrate heating device outputs the first drive signal that switches on and off the semiconductor switch at least once, and the second drive signal switches on the semiconductor switch at least once after the first drive signal is output, and whose period when the semiconductor switch is ON is longer than one of the first drive signals.

With these outputs, in the temperature distribution in the thickness direction of the substrate heated using the first drive signal and the second drive signal, the temperature difference becomes smaller and the thermal strain experienced by the semiconductor wafer can be reduced, as compared to the case of heating the flash lamp with a single light pulse. Thus, the present invention has a great effect in suppressing deformation and cracking in the semiconductor wafer.

Hereafter, specific embodiment will be explained with reference to the accompanying drawings.

BRIEF DESCRIPTION OF THE DRAWINGS

FIGS. 4a & 4b illustrate heating of a semiconductor wafer with a heating device and 4c & 4d are graphs showing a comparison of the temperature state in the thickness direction between the case of heating a semiconductor wafer with a heating device using a flash lamp and in the case of increasing the temperature with a flash of a single light pulse.

DETAILED DESCRIPTION OF THE INVENTION

Figures 1A, 1B:
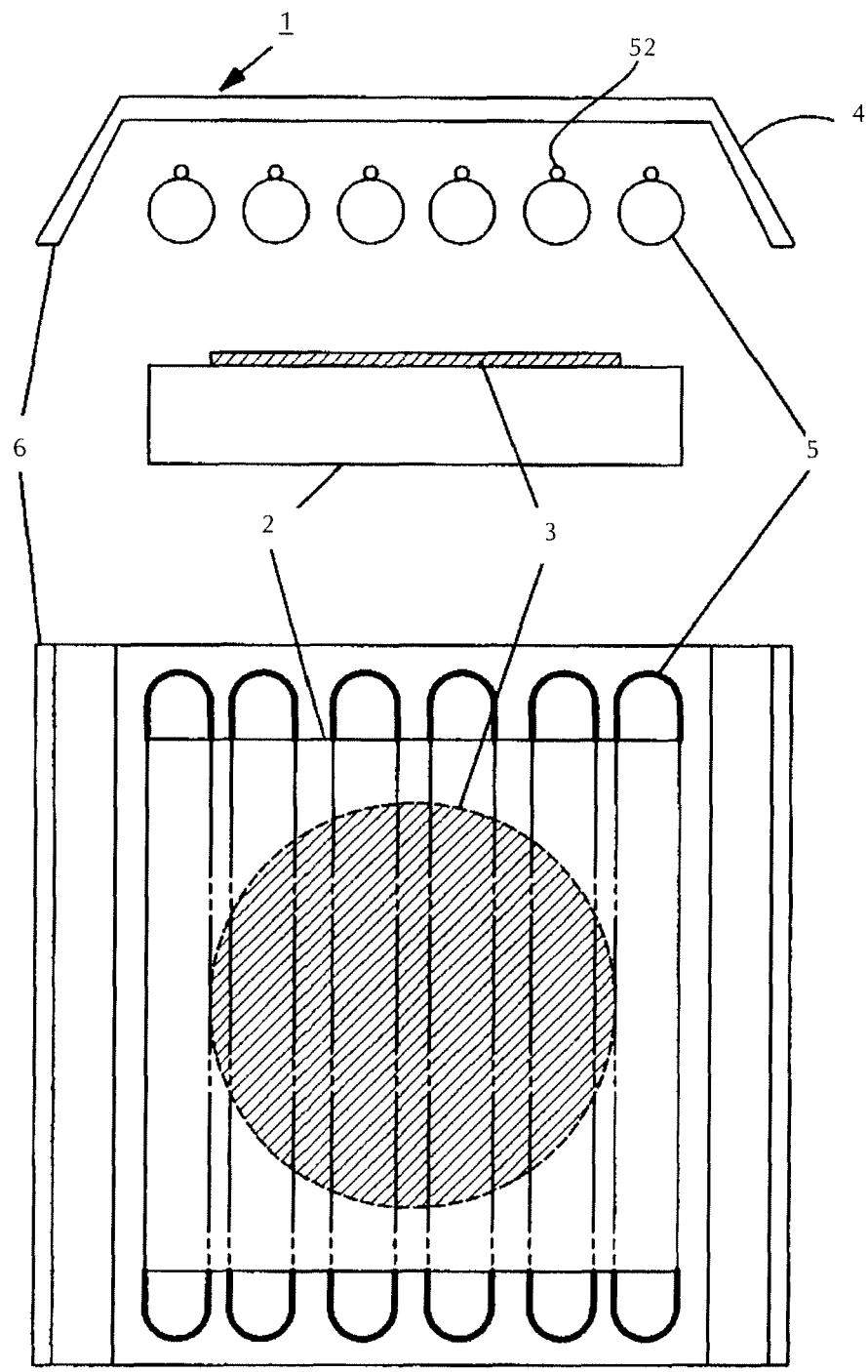
FIGS. 1a & 1b are schematic diagrams showing side sectional and top plan views, respectively, of the configuration of a heating substrate device of the present invention.

FIG. 1 shows a substrate heating unit 1 in accordance with the present invention in which a semiconductor wafer (substrate) 3 is arranged on a hot plate 2, and a light irradiating part 4 is arranged above the upper surface of the semiconductor wafer 3. The light irradiating part 4 is composed of a plurality of straight tube-shaped flash lamps 5 arranged in parallel to a reflecting mirror 6 for reflecting light from the flash lamps 5 toward the facing side of the semiconductor wafer 3. A trigger electrode 52 is mounted to the flash lamps 5 at the side of the reflecting mirror 6, i.e., the side facing away from the facing side of the semiconductor wafer 3.

Figure 2:
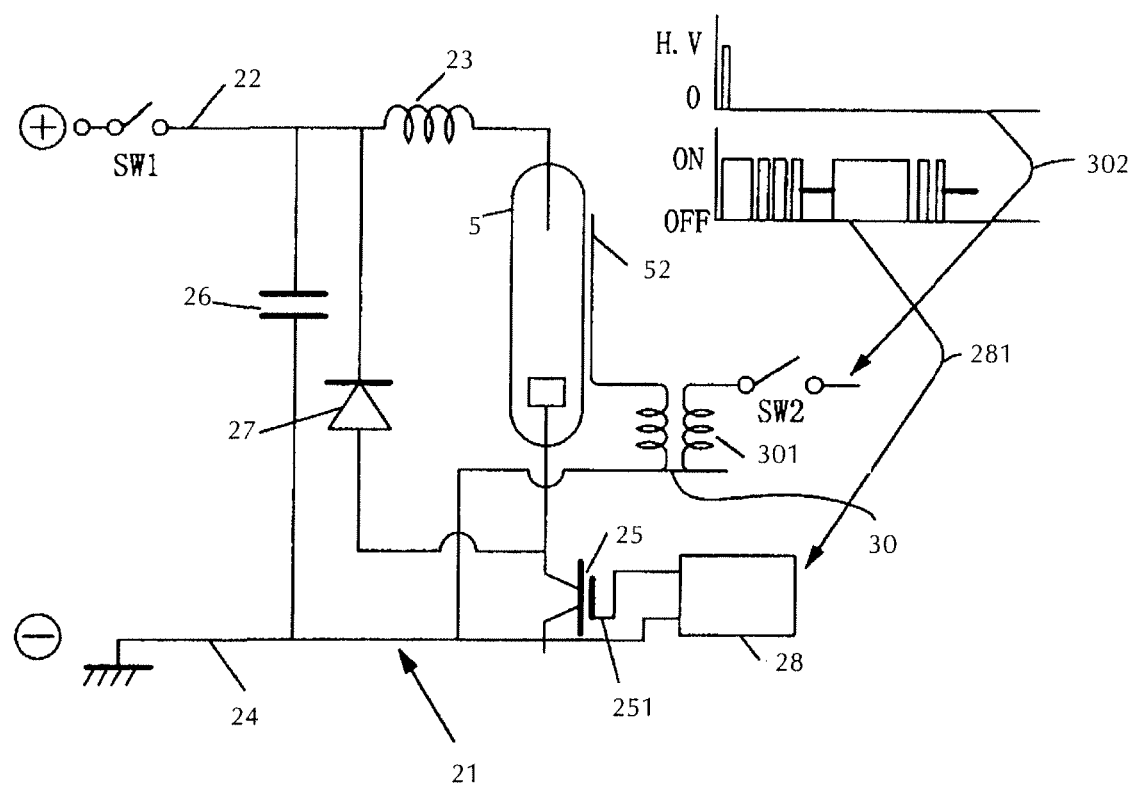
FIG. 2 is a diagram showing one example of the flash lamp lighting circuit for use in accordance with the present invention.

FIG. 2 shows one example of a flash lamp lighting circuit 21 for realizing the present invention. A coil 23 and an IGBT element 25 as the semiconductor switch are connected in series to the flash lamp 5 at the high voltage side 22 and a ground side 24, respectively.

Further, a capacitor 26 for supplying energy to the flash lamp 5, and a diode 27 for controlling a feedback current associated with opening and closing of a gate 251 of the insulated gate bipolar transistor (IGBT element) 25 are connected in parallel to the flash lamp 5, respectively. Supplying energy to the capacitor 26 is started by switching on the switch SW1 arranged at the high voltage side 22.

Further, a gate circuit 28 is placed in the IGBT element 25 and controls the current flowing into the flash lamp 5 by switching on and off the gate 251 in accordance with a gate signal 281 to be input externally.

In addition, the trigger electrode 52 for illuminating the flash lamp 5 is placed on the lamp 5, and the trigger electrode 52 is connected to a trigger coil 30. Voltage pulses are supplied to a primary side 301 of the trigger coil 30 in accordance with a trigger signal 302 of the flash lamp 5. This action is started by switching on the switch SW2.

Figure 3:
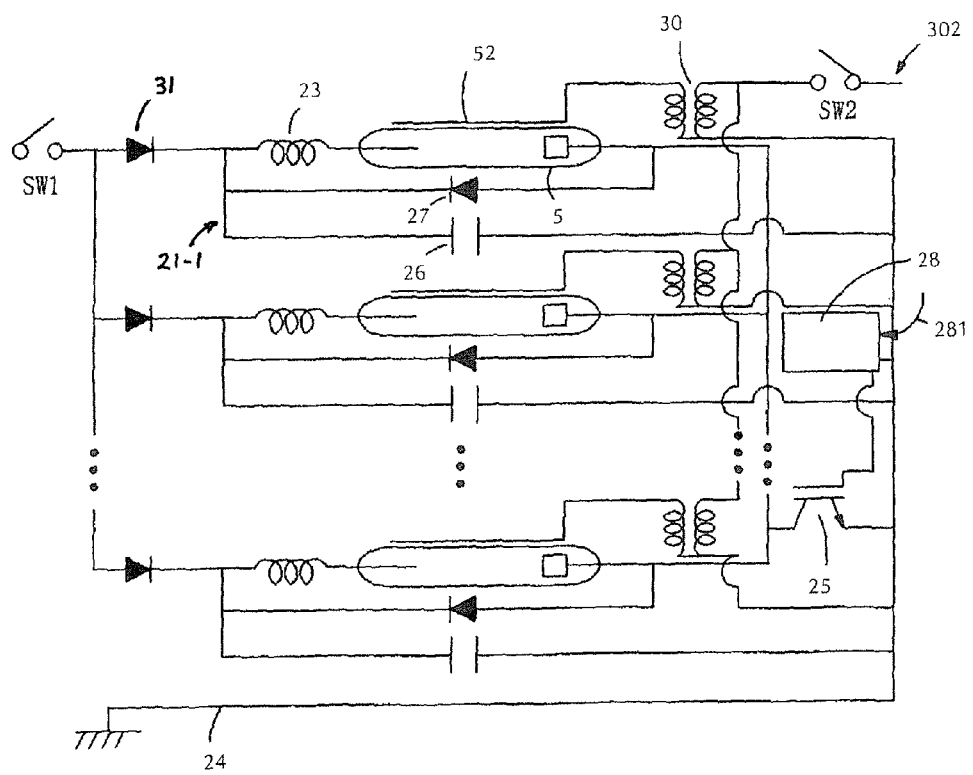
FIG. 3 is a diagram showing an example of a flash lamp lighting circuit for illuminating a plurality of flash lamps.

FIG. 3 shows an example of a lighting circuit for operating a plurality of flash lamps.

As shown in FIG. 3, a diode 27 is connected in parallel to a series circuit of flash lamps 5-1 to 5-n and the coils 23, respectively, and a connecting point of the coil 23 and the diode 27 is commonly connected via a diode 31, and is connected to the + side of the power source via the switch SW1.

Further, the connecting points of the flash lamps 5-1 to 5-n and the diode 27 are commonly connected to one of terminals of the IGBT element 25, the other terminal of the IGBT element 25 is connected to the ground 24 of the power source, and a gate circuit 28 is connected to the gate terminal of the IGBT element 25.

In addition, the trigger electrode 52 of the flash lamps 5-1 to 5-n are connected respectively to trigger coils 30, and the primary side 301 of each trigger coil 30 is commonly connected, and connected to the switch SW2.

In the case of configuring a plurality of lighting circuits of the flash lamps, as shown in FIG. 3, lighting circuits 21-1 to 21-n are connected to the flash lamps, respectively, and for example, the switches SW1 and SW2, the IGBT element 25 and the gate circuit 28 can be commonly used. Thus, commonly using the switches SW1 and SW2 and the IGBT element 25 enables minimization of variation in illumination timing of the flash lamps.

FIGS. 4a-4d show a comparison of the temperature state in the thickness direction between the case of heating a semiconductor wafer with a heating device using the flash lamps and the case of increasing the temperature with a single pulse flash light.

FIG. 4(a) is a similar diagram as that shown in FIG. 1, and is a schematic depiction of the heating device 1 having the semiconductor wafer 3 arranged on the hot plate 2 and the light irradiating part 4 where a plurality of flash lamps 5 are arranged on the surface side of the semiconductor wafer 3. The heating device 1 uses a reflecting mirror 6 to reflect light emitted from the flash lamp 5 toward the semiconductor wafer 3, and each flash lamp 5 has a trigger electrode 52 on the side facing the reflecting mirror 6.

FIG. 4(b) is an enlarged diagram of a portion n surrounded with a broken line in FIG. 4(a), showing a portion of the semiconductor wafer 3 and the hot plate 2. Further, points A, B and C are placed as a pattern in the thickness direction of the semiconductor wafer 3, A representing the topmost surface, B an intermediate area and C a rear surface, respectively. Furthermore, the topmost surface as used herein refers to a portion at the light irradiation surface side of the substrate wafer of from 3 to 10 μm in depth, and the intermediate area indicates a portion from 10 μm up to 100 μm. Further, the rear surface indicates the surface making contact with the hot plate 2.

FIG. 4(c) shows the relationship between the temperature and time at the points A, B and C shown in FIG. 4(b). The horizontal axis indicates time, and the points of time a, c, d and e represents the following timing, respectively:

In particular, a is a point of time to start increasing the temperature of the semiconductor wafer 3; c is a point of time when a trigger signal of the flash lamp 5 is input; d is a point of time when a gate signal of the IGBT element 25 for increasing the temperature of the semiconductor wafer 3 to the highest temperature is turned on; and e is a point of time when the temperature is dropped to the one before illuminating the flash lamp.

On the topmost surface of the semiconductor wafer 3 (the line A indicated with a solid line), the temperature rises to 500° C. at the point c, to 800° C. at the point d, and then, reaches the highest temperature of 1,300° C., and then lowers to 500° C. at the point e.

Next, on the intermediate level of the semiconductor wafer 3 (at the thickness depth of 100 μm: shown with a broken line B), when illumination of the flash lamp 5 is started, the temperature starts to rise at a little slower pace than the line A, and reaches 700° C. at the point d, then reaches the highest temperature of 1,000° C., and then drops to 500° C. at the point e. Next, on the rear surface of the semiconductor wafer (shown as chain double-dashed line C), when illumination of the flash lamp 5 is started, the start of the temperature increase is greatly delayed relative to that represented by the solid line A and the broken line B. Then, the temperature rises moderately even at the point of time d, and only reaches a temperature of 550° C., after which it gradually declines.

Furthermore, in FIG. 4(c), the periods from the point of time a to the point of time c, from the point c to the point of time d, and the point of time d to the point of time e are indicated with the same length; however, the period from the point of time a to the point of time c is, for example, approximately 3 minutes; from the point of time c to the point of time d is, for example, approximately 0.1 seconds; and from the point of time d to the point of time e is, for example, approximately 0.01 seconds.

FIG. 4(d) shows a comparative example relative to the present invention, and a case where energy accumulated in a capacitor is supplied to the flash lamp 5 at once as in the prior art, and one pulse of light is irradiated.

The points A, B and C on the semiconductor wafer 3 shown in FIG. 4(d) correspond to the points shown in FIG. 4(b), respectively, and points of time a, f and e indicate the timing mentioned below, respectively.

In particular, a is a point of time at which increasing of the temperature of the semiconductor wafer 3 starts; f is a point of time when a trigger signal is input into the flash lamp 5 after electric charges are accumulated in the capacitor (the flash lamp 5 starts to emit light from this point of time); and e is a point of time when the temperature drops back to that at the time that the flash lamp is lit.

The temperature of the points A, B and C at the point of time f on the semiconductor wafer 3 in this comparative example is 500° C. Afterwards, the flash lamp 5 starts to emit light, and then, the temperature reaches the highest temperature: 1,300° C. at the point A, 900° C. at the point B and 520° C. at the point C, and then, drops back to 500° C. at point of time e.

A comparison of FIG. 4(c) and FIG. 4(d) reveals that both in FIGS. 4(c) and 4(d), the temperature achieved at the point A, which is a the topmost surface of the semiconductor wafer 3, is set to increase up to 1,300° C., and the temperatures achieved at the point B and the point C are different in FIG. 4(c) and FIG. 4(d). In other words, for example, the temperature achieved at the point B is 1,000° C. in FIG. 4(c) while it is 900° C. in FIG. 4(d).

With such a temperature distribution, at the point A, which is at the topmost surface, stretching due to heat expansion of the semiconductor wafer 3 occurs according to the temperature of 1,300° C. On the other hand, at the point B, which is at an intermediate level, the temperature is lower, and a difference in heat expansion occurs as compared to the expansion at the topmost surface.

This difference in the heat expansion occurs within a very short time when the flash lamp 5 is lit, and the difference in the heating expansion associated with a great difference in temperature in the depth direction of the semiconductor wafer 3 leads to the stress that is experienced by the semiconductor wafer 3.

In the case of FIG. 4(c) of the present invention, as compared to FIG. 4(d) (the conventional temperature-rising method), the difference in temperature is smaller by 100° C., and the stress occurring in the semiconductor wafer 3 is small. According to this phenomenon, it appears that distortion and cracking in the semiconductor wafer 3 can be suppressed.

In order to minimize the difference in temperature between the point A, which is at the topmost surface of the semiconductor 3, and the point B, which is at an intermediate level, a drive circuit for outputting a first drive signal that switches on and off the semiconductor switch (IGBT element 25), and a second drive signal that switches on the semiconductor switch after the first drive signal is output is used, and the time period when the semiconductor switch is ON by the second drive signal is designed to be longer than the time period when the semiconductor switch is ON by one of the first drive signals, and when the flash lamp 5 arranged in the heating device is lit, the flash lamp 5 is lit by switching on and off the semiconductor switch by the first drive signal, and the substrate temperature is increased to the second level, which is lower than the desired temperature to be achieved, and then the semiconductor switch is switched on by the second drive signal to increase the temperature of the topmost surface of the substrate up to the desired temperature to be achieved (1,300° C. in this embodiment).

Thus, when the flash lamp 5 is lit, the semiconductor switch is switched on and off, for example, with on-off signals with a predetermined duty cycle, and the current flowing into the flash lamps 5 is limited. As a result, the temperature gradient in the depth direction the semiconductor wafer 3 can be moderated.

Herein, it is desirable to conduct a treatment to increase the temperature of the semiconductor wafer 3 within a short time as described above, and the time to increase the temperature and the treatment temperature shall be decided appropriately, according to the type of the semiconductor wafer 3 and the treatment (for example, depth of ion induction treatment on a surface, and a heat damage to a laminated thin layer).

Figure 5:
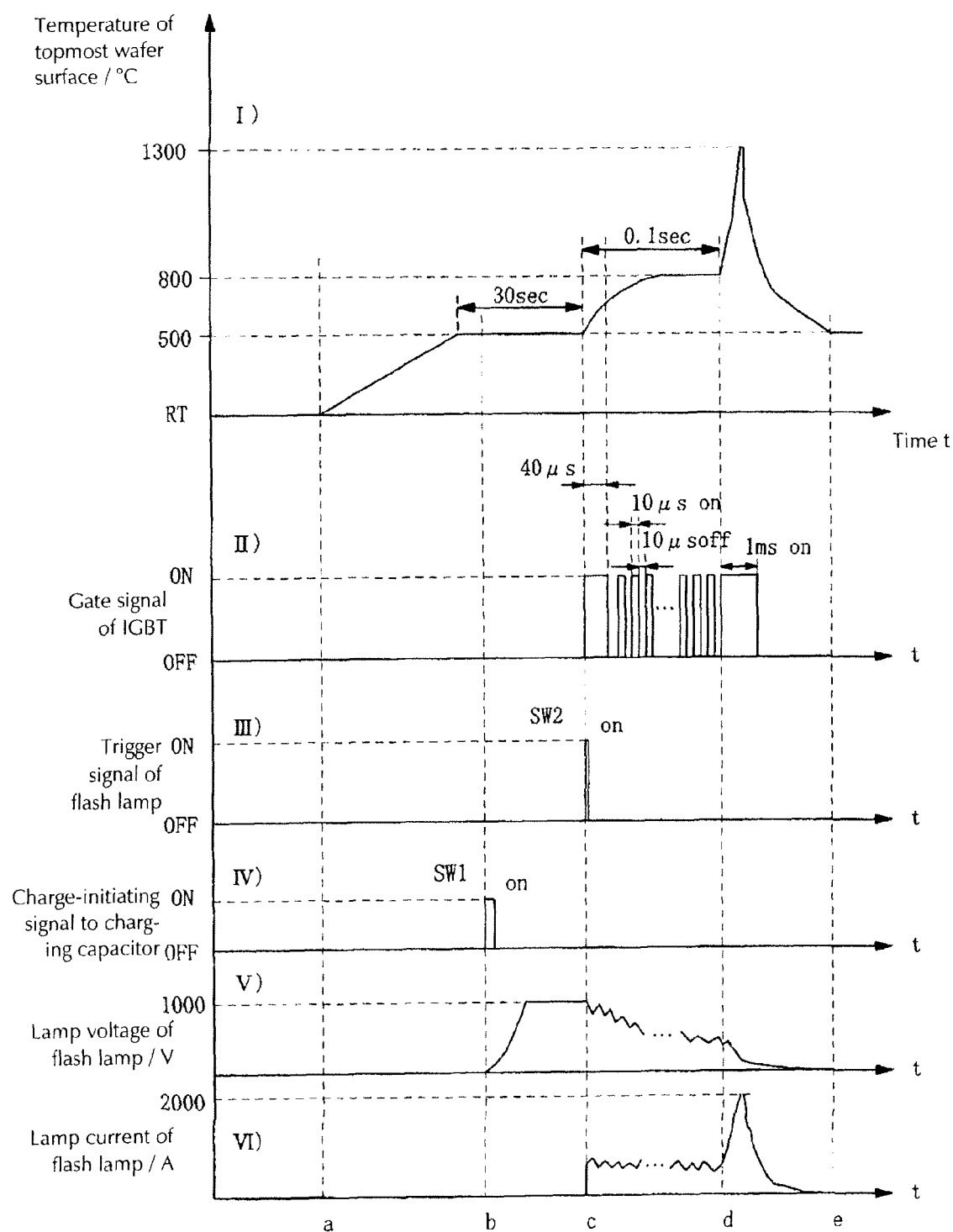
FIG. 5 is a graph for explaining the timing of the elevating temperature pattern of the first embodiment of the present invention.

FIG. 5 is a graph of the timing of the temperature-rising pattern in the first embodiment of the present invention, and shows a case where the first drive signal is composed of a drive signal that allows the first drive signal to be ON, for example, for 40 μsec, for the purpose of forming an arc discharge throughout the entire tube axis direction, and another drive signal that repeats on and off with a certain duty cycle, the second drive signal being composed of an on-signal that continues for a certain period of time.

The graph of FIG. 5 shows, respectively from the top: (I) the relationship between temperature and time of the topmost surface of the semiconductor wafer 3; (II) the gate signal to be input into the IGBT element; (III) the input timing of the trigger signal for illuminating the flash lamp 5; (IV) the charge-initiating signal to the charging capacitor to supply power to the flash lamp 5; (V) the lamp voltage of the flash lamp 5; and (VI) the lamp current of the flash lamp 5. The horizontal axis indicates the time, and the vertical axis indicates the temperature from room temperature up to 1,300° C.

In FIG. 5, if the time is shown at the horizontal axis, heating to the semiconductor wafer 3 starts at a certain point of time a. This indicates a point of time when the hot plate 2 is arranged as a resistance heating apparatus as described above and the semiconductor wafer 3 is placed on the hot plate and the power supply of the hot plate 2 is switched on, or a point of when the semiconductor wafer 3 itself is placed on the pre-heated hot plate, and the topmost surface temperature of the semiconductor wafer 3 also starts rising from this point of time a.

After the topmost surface temperature of the semiconductor wafer 3 reaches 500° C., the temperature is maintained. When the temperature maintenance is started, for example, a charging-initiating signal is issued for starting the charging of the charging capacitor 26 in order to illuminate the flash lamp 5 at a point of time b (FIG. 5(IV)). When the capacitor charging signal is received, voltage is applied to both ends of the flash lamp 5 (FIG. 5(V)). In this embodiment, for example, a voltage of 4000 V is applied to the flash lamp 5.

Next, at the point of time c, the trigger signal is turned on to start applying high voltage to the trigger electrode 52 in order to illuminate the flash lamp 5 (FIG. 5(III)). In association with this, the on-signal to open the gate of the IGBT element 25 connected to the flash lamp 5 is issued (FIG. 5(II)).

The initial pulse of the gate on-signal of the IGBT element is turned on for 40 μseconds to form the arc discharge of the flash lamp 5 throughout the entire tube axis direction of the lamp 5. The gate on-signal following this repeats a cycle of 1 pulse with a 10 μsecond on-period and an off-period for 10 μseconds more than once. This cycle repeats until the point of time d. During this period (from c to d), the temperature of the topmost surface of the semiconductor wafer 3 is increased to 800° C. and maintained.

Further, the lamp voltage of the flash lamp 5 is gradually reduced according to the on and off cycle of the gate-on signal. Further, the lamp current flows according to illumination of the flash lamp 5 (FIG. 5(VI)).

At the point of time d, the temperature of the semiconductor wafer 3 is increased to the target temperature by the main discharge of the flash lamp 5. Herein, the gate-on time, for example, is 1 msec, and the energy charged in the capacitor is all discharged. At this point, approximately 2,000 A of lamp current flows, and light is emitted from flash lamp 5. This light emitted from the flash lamp 5 causes the rapid increase in the temperature of the topmost surface of the semiconductor wafer 3 up to 1,300° C.

In this embodiment, the temperature is increased from room temperature up to 500° C. in a minute, and is maintained at 500° C. for 30 seconds, and then, the flash lamp 5 is lit in accordance with the trigger signal. For this illumination, the gate signal of the IGBT element 25 is turned on for first 40 μseconds, and then 13 turn-on cycles of 10 μseconds and off cycles of 10 μseconds were repeated.

At this point (at the point of time after a total of 300 μseconds passed after the input of the trigger signal), the temperature of the topmost surface of the semiconductor wafer 3 reaches 800° C. Next, the gate signal of the IGBT element 25 is turned on for 1 msec, and all of the energy accumulated in the capacitor is discharged. This causes the temperature of the topmost surface of the semiconductor wafer 3 to reach 1,300° C. After reaching 1,300° C., which is the treatment temperature of the semiconductor wafer 3, the temperature is lowered down to 500° C.

In this embodiment, 40 μseconds or longer and 100 μseconds or shorter are sufficient for the gate-on signal to open the gate of the IGBT element 25 to spread the arc to the entire flash lamp 5.

The pulse to be input as the gate signal for the IGBT element 25 should be an on-signal within the range of 10 μsec to 80 μsec, an off-signal within the range of 10 μsec to 30 μsec, and a total time of 1 msec to 100 msec. Also, for the main discharge of the flash lamp 5, if the gate signal to be input into the IGBT element 25 is within the range of 0.1 msec to 10 msec, 1,300° C. to be achieved can be reached. Furthermore, after the target temperature, 1,300° C., is reached, it drops to 500° C. within 1 msec to 100 msec.

In order to confirm the effect of the present invention, a light irradiation experiment by the flash lamp 5 to the semiconductor wafer 3 was conducted under a condition of the temperature of the topmost surface of the semiconductor wafer 3 up to 1,500° C. The semiconductor wafer 3 used for the experiment was a Si semiconductor substrate that had 200 mm diameter, and 725 μm thickness. Further, for the substrate heating device, a device that can uniformly irradiate the semiconductor wafer 3 with 200 mm of a diameter was used. First, light was irradiated under the conditions below as the conventional method. The pre-heating temperature by the hot plate was 400° C., the on-time of discharging current flash lamp 5 was 1 ms, and the peak current was 3,000 A.

When five semiconductor wafers 3 were irradiated under the same condition, three wafers were deformed, and two wafers were cracked. With the conventional method of illuminating the flash lamp 5 with this one-time only increase of the temperature, the semiconductor wafer 3 was certainly deformed or cracked.

Next, light was irradiated to the semiconductor wafer 3 using the present invention. As the conditions, the hot plate 2 was preheated at 400° C.; as the on-time of current discharge of the flash lamp 5, the gate was on for the first 40 μs using the IGBT element 25 as shown in FIG. 5 to make certain to grow the arc of the flash lamp 5; then thirteen times of switching on for 10 μs and off for 10 μs were repeated.

After that, 2,500 A of peak current flowed and the switch was on for approximately 1 ms. This raised the surface temperature of the topmost surface of the semiconductor wafer 3 to 1,500° C. After heating five semiconductor wafers 3 under this condition, none of the five wafers had distortion or cracking.

Figure 6:
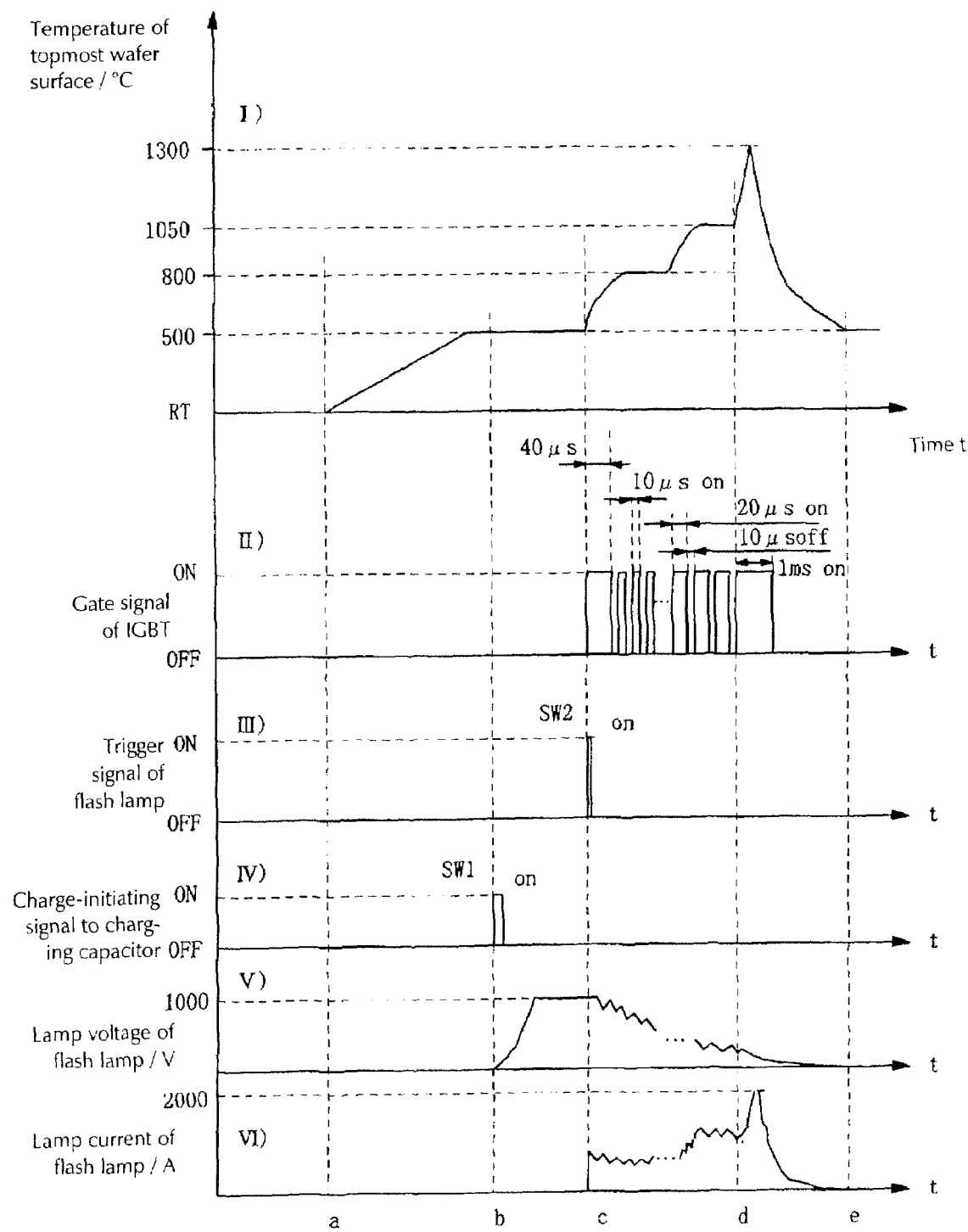
FIG. 6 is a graph of a second embodiment showing the timing of another elevating temperature pattern in accordance with the present invention.

FIG. 6 shows another temperature elevation pattern in accordance with a second embodiment of the present invention. The parts (I) to (V) correspond to the same parts as in FIG. 5, and show the relationship between temperature and time of the topmost surface of the semiconductor wafer 3, the gate signal to be input to the IGBT element, the input timing of the trigger signal, a charging-initiating signal to the charging capacitor, the lamp voltage and the lamp current, respectively.

FIG. 6 is the same as FIG. 5 until the point of time c when the trigger signal of the flash lamp 5 is input. The pulse width to be input first as a gate signal of the IGBT element 25 is 40 μsec, similar to FIG. 5.

Subsequently, in this embodiment, until the topmost surface temperature of the semiconductor wafer 3 reaches 800° C., the IGBT element 25 is driven by the first drive signal, and the lamp is lit by switching the gate signal on and off for 10 μsec each. In addition, after that, the lamp is lit by switching on the gate signal for 20 μsec and off for 10 μsec, and the surface temperature of the topmost surface of the semiconductor wafer 3 is increased to 1,050° C.

Next, the IGBT element 25 is driven by the second drive signal, and on-time of the gate is extended to 1 ms to discharge all energy accumulated in the capacitor for discharging the flash lamp 5, and the surface temperature of the topmost surface of the semiconductor wafer 3 is increased to 1,300° C. Then, the temperature is lowered to 500° C., which is the temperature for pre-heating by the hot plate. As in this embodiment, changing the pattern of the gate signal of the IGBT element 25 enables control of the pattern of elevating-temperature of the topmost surface temperature of the semiconductor wafer 3.

Figure 7:
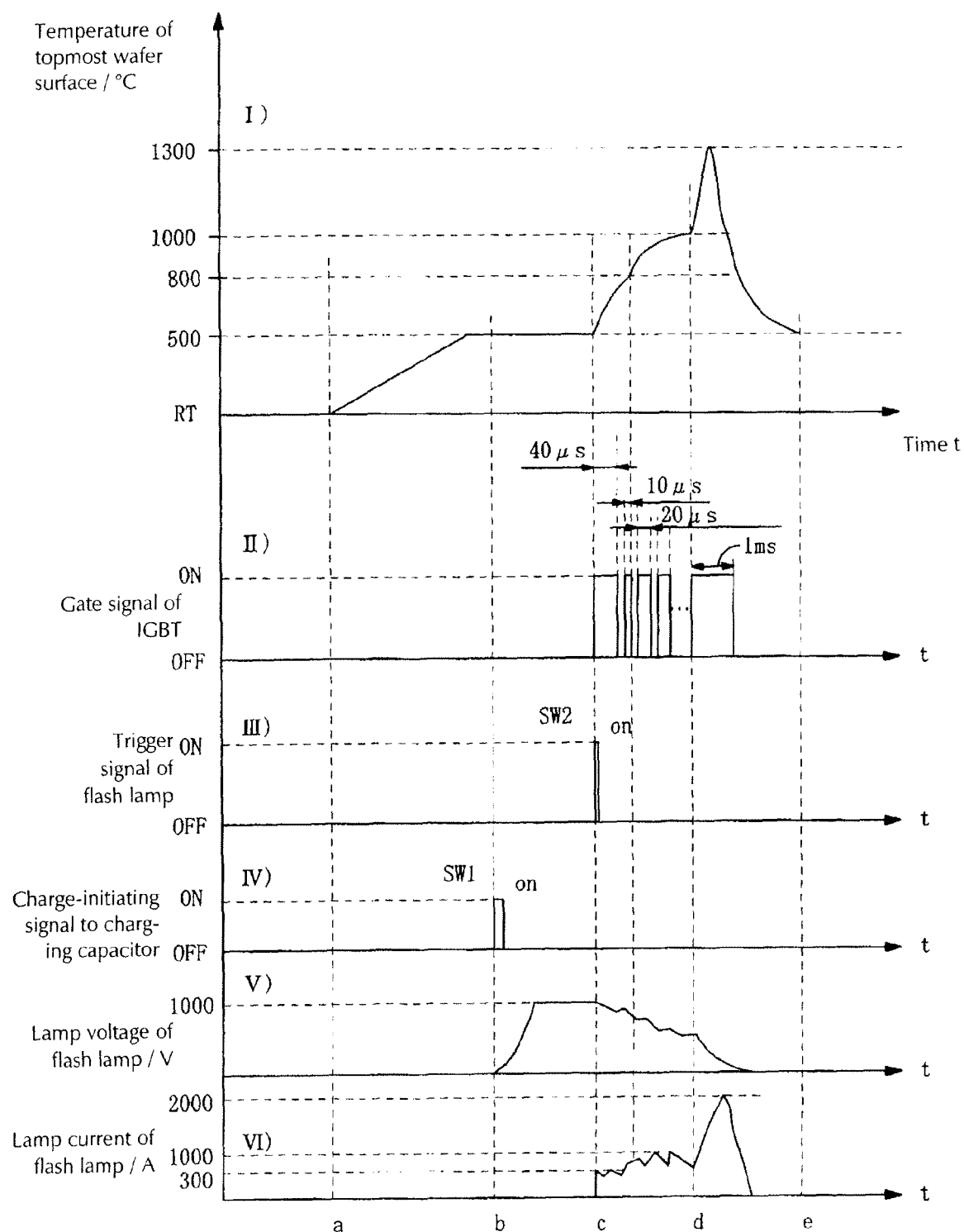
FIG. 7 is a graph showing the timing of the elevating temperature pattern of a third embodiment of present invention.

FIG. 7 shows another temperature elevation pattern in accordance with a third embodiment of the present invention, and parts (I) to (VI) are the same as in FIG. 5, indicating the relationship between temperature and time of the topmost surface of the semiconductor wafer 3, the gate signal to be input to the IGBT element, the input timing of the trigger signal, a charging-initiating signal to the charging capacitor, the lamp voltage and the lamp current, respectively.

FIG. 7 is also the same as FIG. 5 until the point of time c when the trigger signal of the flash lamp 5 is input.

In addition, the IGBT element 25 is driven by the first drive signal, and in this embodiment, the pulse width to be input first as a gate signal of the IGBT element 25 is 40 μsec as similar to FIGS. 5 & 6. However, switching the gate signal of the IGBT element 25 to be input is turned on for 10 μsec, off for 10 μsec, on for 20 μsec and off for 10 μsec, and this enables the surface temperature of the topmost surface of the semiconductor wafer 3 to increase to 800° C. in a shorter time.

After that, switching on the gate signal of the IGBT element 25 for 20 μsec and the following gate signal off for 20 μsec raises the surface temperature of the topmost surface of the semiconductor wafer 3 up to 1,000° C. In addition, after an off-time of 10 μsec, the IGBT element signal 25 is driven by the second drive signal, and on-time of the gate is extended to 1 ms. With this operation, all energy accumulated in the capacitor is discharged for discharging electricity of the flash lamp 5, and the topmost surface temperature of the semiconductor wafer 3 is increased to 1,300° C. Then, the temperature is lowered to 500° C., which is the temperature of pre-heating by the hot plate. Thus, changing the on-time of the gate signal of the IGBT element 25 enables the control of the pattern of elevating temperature of the topmost surface temperature of the semiconductor wafer 3.

Figure 8:
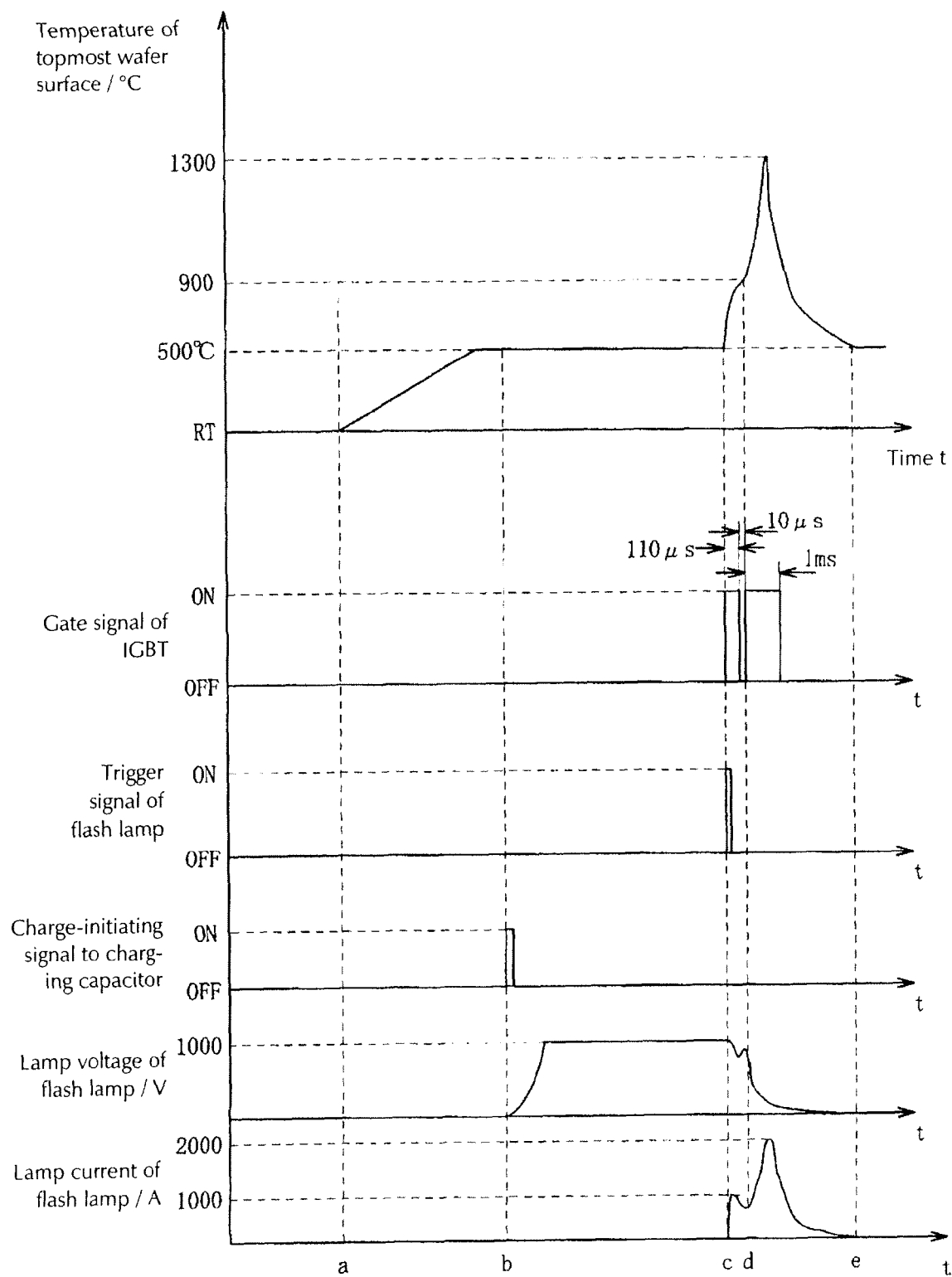
FIG. 8 is a graph showing the timing the elevating temperature pattern in accordance with a fourth embodiment of the present invention.
Figure 9:
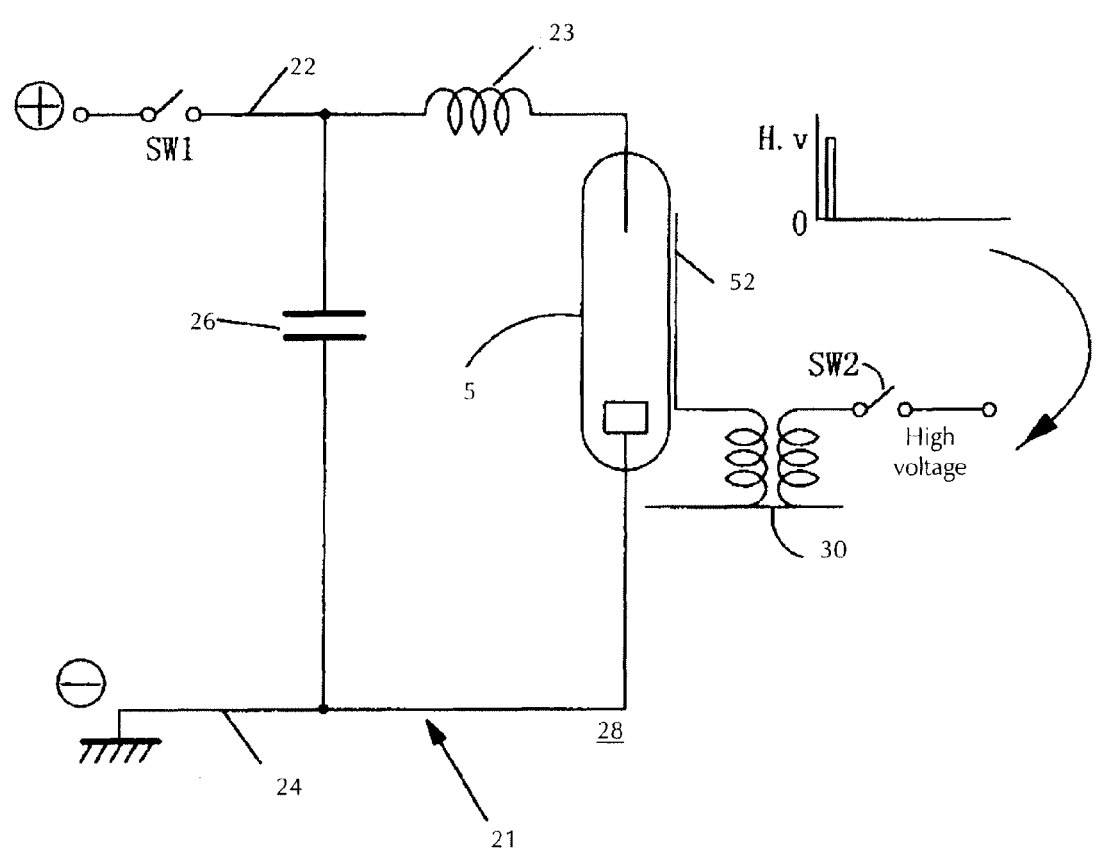
FIG. 9 is a diagram showing one example of the conventional lighting circuit for a flash lamp.

FIG. 8 shows another temperature elevation pattern in accordance with a fourth embodiment of the present invention, and parts (I) to (VI) are the same as in FIG. 5, showing the relationship between temperature and time of the topmost surface of the semiconductor wafer 3, the gate signal to be input to the IGBT element, the input timing of the trigger signal, a charging-initiating signal to the charging capacitor, the lamp voltage and the lamp current, respectively.

FIG. 8 is also the same as FIG. 5 until the point of time c when the trigger signal of the flash lamp 5 is input.

In this embodiment, the first drive signal sent to the IGBT element 25 is a gate signal with a single pulse. That is, switching the gate signal of the IGBT element 25 on for 110 μs causes the increase of the surface temperature of the topmost surface of the semiconductor wafer 3 to 900° C.

In addition, after the off-time for 10 μsec, the IGBT element 25 is driven by the second drive signal, and the on-time of the gate is extended to 1 ms. This results in the discharge of all energy accumulated in the capacitor for illuminating of the flash lamp 5, and the topmost surface temperature of the semiconductor wafer 3 is increased to 1,300° C.

Then, the temperature is lowered to 500° C., which is the pre-heating temperature by the hot plate. Thus, changing the on-time of the gate signal of the IGBT element 25 enables the control of the pattern of elevating temperature of the topmost surface of the semiconductor wafer 3.

What is claimed is:

1. A substrate heating device for heating a substrate by a lamp heating device, comprising:
   a power source;
   a capacitor charged by the power source;
   a flash lamp that discharges by electrical charges accumulated in the capacitor;
   an inductance connected between the capacitor and the flash lamp;
   a trigger unit causing the flash lamp to start discharging, wherein the substrate heating device comprises:
   a diode connected in parallel to a series circuit composed of the flash lamp and the inductance,
   a semiconductor switch connected in series to the flash lamp, and
   a control unit for controlling on/off of the semiconductor switch;
   wherein the control unit has a drive circuit for outputting a first drive signal causing the semiconductor switch to turn on and off at least once after a trigger signal is input into the trigger unit, and for outputting a second drive signal causing the semiconductor switch to turn on only once after the first drive signal is output; and
   wherein a time period during which the second drive signal causes the semiconductor switch to turn on is longer than that a drive signal of the first drive signals causes the semiconductor switch to turn on;
   wherein the first drive signal is an on-off signal of which an on signal causes the semiconductor switch to keep in the on-state and an off signal causes the off-state to alternately be produced more than once;
   wherein a duty ratio of the on-off signal, defined as the period of the on signal divided by the sum of the period of on signal plus the period of the off signal, is changed during the time when the first drive signal is output such that a temperature difference between a top surface and a bottom of said substrate amounts to at least a temperature difference where an ion diffusion is not spread throughout the entire substrate, and amounts to a temperature difference range at which no adverse effect by thermal strain is effected, and
   wherein the second drive signal is adapted to increase the surface temperature of said substrate to a desired temperature which is higher than the temperature at the top surface obtained by said first dive signal.

2. The substrate heating device according to claim 1, wherein a second heating device is arranged on an opposite side of the substrate relative to that at which the flash lamp is located, the second heating device comprising a lamp heating device.

3. The substrate heating device according to claim 1, wherein the semiconductor switch is an insulated gate bipolar transistor.

4. The substrate heating device according to claim 1, wherein a plurality of flash lamps is provided.

5. The substrate heating device according to claim 4, wherein the flash lamps are straight tube-shaped flash lamps arranged in parallel to a reflecting mirror for reflecting light from the flash lamps toward the substrate.

6. The substrate heating device according to claim 1, wherein the first drive signal is adapted to only partially discharge the capacitor while the second drive signal is adapted to fully discharge the capacitor.

* * * * *